(12) United States Patent
Rohatgi et al.

(10) Patent No.: US 7,790,574 B2
(45) Date of Patent: Sep. 7, 2010

(54) BORON DIFFUSION IN SILICON DEVICES

(75) Inventors: Ajeet Rohatgi, Atlanta, GA (US); Dong Seop Kim, Atlanta, GA (US); Kenta Nakayashiki, Smyrna, GA (US); Brian Rounsaville, Stockbridge, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 946 days.

(21) Appl. No.: 11/301,527

(22) Filed: Dec. 13, 2005

(65) Prior Publication Data

US 2006/0183307 A1     Aug. 17, 2006

Related U.S. Application Data

(60) Provisional application No. 60/637,717, filed on Dec. 20, 2004.

(51) Int. Cl.
   *H01L 21/00* (2006.01)
(52) U.S. Cl. .................. 438/460; 148/33.3; 148/33.5; 438/558; 438/560
(58) Field of Classification Search .............. None
   See application file for complete search history.

(56) References Cited

U.S. PATENT DOCUMENTS

| | | | | |
|---|---|---|---|---|
| 2,794,846 A | * | 6/1957 | Fuller | 136/256 |
| 3,104,991 A | * | 9/1963 | MacDonald, Jr. | 438/460 |
| 3,369,939 A | | 2/1968 | Myer | |
| 3,486,951 A | * | 12/1969 | Norby | 438/558 |
| 3,653,970 A | | 4/1972 | Iles | |
| 3,895,975 A | * | 7/1975 | Lindmayer | 438/89 |
| 3,969,746 A | | 7/1976 | Kendall et al. | |
| 3,976,508 A | | 8/1976 | Mlavsky | |
| 4,104,091 A | * | 8/1978 | Evans et al. | 438/57 |
| 4,110,122 A | | 8/1978 | Kaplow et al. | |
| 4,152,824 A | * | 5/1979 | Gonsiorawski | 438/98 |
| 4,156,622 A | | 5/1979 | Lindmayer | |
| 4,242,693 A | * | 12/1980 | Biran | 257/470 |
| 4,277,525 A | * | 7/1981 | Nakayama et al. | 427/387 |
| 4,360,393 A | | 11/1982 | Koval | |
| 4,377,901 A | | 3/1983 | David et al. | |

(Continued)

FOREIGN PATENT DOCUMENTS

ES     2149126     10/2000

(Continued)

OTHER PUBLICATIONS

Münzer, K.A., et al., "High Throughput Industrial In-Line Boron BSF Diffusion", 20th European Photovoltaic Solar Energy Conference, Jun. 6-10, 2005, Barcelona, Spain, pp. 777-780.

*Primary Examiner*—David E Graybill
(74) *Attorney, Agent, or Firm*—Alston & Bird LLP

(57) ABSTRACT

Disclosed are various embodiments that include a process, an arrangement, and an apparatus for boron diffusion in a wafer. In one representative embodiment, a process is provided in which a boric oxide solution is applied to a surface of the wafer. Thereafter, the wafer is subjected to a fast heat ramp-up associated with a first heating cycle that results in a release of an amount of boron for diffusion into the wafer.

16 Claims, 6 Drawing Sheets

U.S. PATENT DOCUMENTS

| | | | |
|---|---|---|---|
| 4,444,992 A | | 4/1984 | Cox, III |
| 4,557,950 A | * | 12/1985 | Foster et al. ............... 438/774 |
| 4,561,171 A | | 12/1985 | Schlosser |
| 4,565,588 A | * | 1/1986 | Seki et al. .................. 438/535 |
| 4,588,454 A | * | 5/1986 | Khadder et al. ............ 438/563 |
| 4,588,455 A | * | 5/1986 | Genser ....................... 438/567 |
| 4,602,422 A | | 7/1986 | Dinh |
| 4,703,553 A | | 11/1987 | Mardesich |
| 4,764,244 A | * | 8/1988 | Chitty et al. ................. 216/20 |
| 4,935,384 A | | 6/1990 | Wanlass |
| 5,009,720 A | | 4/1991 | Hokuyo et al. |
| 5,067,985 A | | 11/1991 | Carver et al. |
| 5,223,442 A | | 6/1993 | Kitagawa et al. |
| 5,248,348 A | | 9/1993 | Miyachi et al. |
| 5,256,887 A | | 10/1993 | Yang |
| 5,270,248 A | | 12/1993 | Rosenblum et al. |
| 5,468,652 A | | 11/1995 | Gee |
| 5,472,488 A | * | 12/1995 | Allman ................. 106/287.16 |
| 5,494,852 A | * | 2/1996 | Gwin ......................... 438/563 |
| 5,527,389 A | | 6/1996 | Rosenblum et al. |
| 5,589,008 A | | 12/1996 | Keppner |
| 5,738,732 A | | 4/1998 | Nakamura et al. |
| 5,786,605 A | * | 7/1998 | Gwin .......................... 257/101 |
| 5,792,280 A | | 8/1998 | Ruby et al. |
| 5,899,704 A | | 5/1999 | Schlosser et al. |
| 5,926,727 A | | 7/1999 | Stevens et al. |
| 5,928,438 A | | 7/1999 | Salami et al. |
| 5,935,345 A | | 8/1999 | Kuznicki |
| 5,961,742 A | | 10/1999 | Tange et al. |
| 6,069,065 A | | 5/2000 | Arimoto et al. |
| 6,071,753 A | | 6/2000 | Arimoto |
| 6,096,968 A | | 8/2000 | Schlosser et al. |
| 6,103,970 A | | 8/2000 | Kilmer |
| 6,180,869 B1 | | 1/2001 | Meier et al. |
| 6,206,996 B1 | | 3/2001 | Hanoka et al. |
| 6,262,359 B1 | | 7/2001 | Meier et al. |
| 6,274,402 B1 | | 8/2001 | Verlinden et al. |
| 6,277,667 B1 | | 8/2001 | Huang et al. |
| 6,326,540 B1 | | 12/2001 | Kilmer et al. |
| 6,333,245 B1 | | 12/2001 | Furukawa et al. |
| 6,337,283 B1 | | 1/2002 | Verlinden et al. |
| 6,361,660 B1 | | 3/2002 | Goldstein |
| 6,373,366 B1 | | 4/2002 | Sato et al. |
| 6,379,995 B1 | | 4/2002 | Kawama et al. |
| 6,387,726 B1 | | 5/2002 | Verlinden et al. |
| 6,423,568 B1 | | 7/2002 | Verlinden et al. |
| 6,444,897 B1 | | 9/2002 | Luque-Lopez et al. |
| 6,448,105 B1 | | 9/2002 | Sterk |
| 6,461,947 B1 | | 10/2002 | Uematsu et al. |
| 6,524,880 B2 | | 2/2003 | Moon et al. |
| 6,528,142 B2 | | 3/2003 | Ikegaya et al. |
| 6,566,235 B2 | | 5/2003 | Nishida et al. |
| 6,632,730 B1 | | 10/2003 | Meier et al. |
| 6,664,631 B2 | | 12/2003 | Meier et al. |
| 6,695,903 B1 | * | 2/2004 | Kubelbeck et al. ..... 106/287.14 |
| 6,696,739 B2 | | 2/2004 | Lee et al. |
| 6,825,104 B2 | | 11/2004 | Horzel et al. |
| 6,846,984 B2 | | 1/2005 | Fath et al. |
| 6,998,288 B1 | | 2/2006 | Smith et al. |
| 7,029,943 B2 | | 4/2006 | Kruhler |
| 7,122,733 B2 | | 10/2006 | Narayanan et al. |
| 7,135,069 B2 | * | 11/2006 | Piwczyk ....................... 117/13 |
| 7,135,350 B1 | | 11/2006 | Smith et al. |
| 7,144,751 B2 | | 12/2006 | Gee et al. |
| 7,170,001 B2 | | 1/2007 | Gee et al. |
| 7,232,484 B2 | | 6/2007 | Cretella et al. |
| 7,238,597 B2 | | 7/2007 | Williams |
| 7,294,779 B2 | | 11/2007 | Watabe et al. |
| 7,323,634 B2 | | 1/2008 | Speakman |
| 7,323,635 B2 | | 1/2008 | Chittibabu et al. |
| 7,335,555 B2 | | 2/2008 | Gee et al. |
| 7,335,835 B2 | | 2/2008 | Kukulka et al. |
| 7,338,726 B2 | | 3/2008 | Blanckaert et al. |
| 7,339,109 B2 | | 3/2008 | Stan et al. |
| 7,339,110 B1 | | 3/2008 | Mulligan et al. |
| 7,368,658 B1 | | 5/2008 | Gruen |
| 2004/0112426 A1 | | 6/2004 | Hagino |
| 2004/0168625 A1 | * | 9/2004 | Piwczyk ....................... 117/19 |
| 2004/0259335 A1 | * | 12/2004 | Narayanan et al. .......... 438/584 |
| 2005/0087760 A1 | * | 4/2005 | Canham et al. ............. 257/101 |
| 2005/0133084 A1 | | 6/2005 | Joge et al. |
| 2005/0189013 A1 | | 9/2005 | Hartley |
| 2005/0268963 A1 | | 12/2005 | Jordan et al. |
| 2006/0102976 A1 | | 5/2006 | Kruhler |
| 2006/0128550 A1 | * | 6/2006 | Leister et al. .................. 501/49 |
| 2006/0130891 A1 | | 6/2006 | Carlson |
| 2006/0183307 A1 | * | 8/2006 | Rohatgi et al. .............. 438/563 |
| 2007/0107773 A1 | | 5/2007 | Fork et al. |
| 2007/0137692 A1 | | 6/2007 | Carlson |
| 2007/0151598 A1 | | 7/2007 | DeCeuster et al. |
| 2007/0215202 A1 | | 9/2007 | Salami et al. |
| 2007/0264746 A1 | | 11/2007 | Onishi et al. |
| 2007/0295399 A1 | | 12/2007 | Carlson |
| 2008/0000519 A1 | | 1/2008 | Takahashi |
| 2008/0000521 A1 | | 1/2008 | Sivoththaman et al. |

FOREIGN PATENT DOCUMENTS

| | | |
|---|---|---|
| GB | 1244812 | 9/1971 |
| WO | WO 2005/086633 | 9/2005 |

* cited by examiner

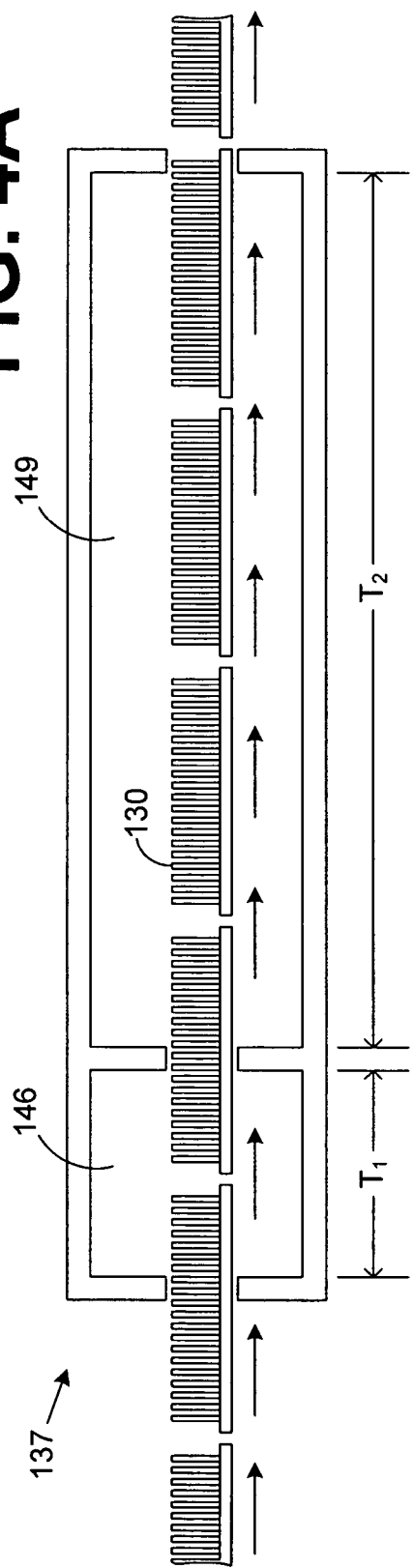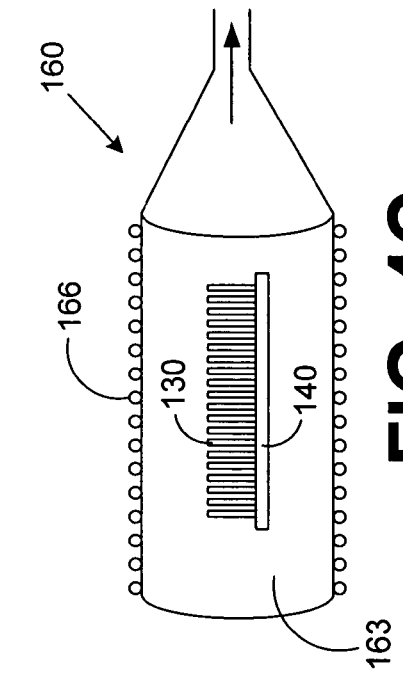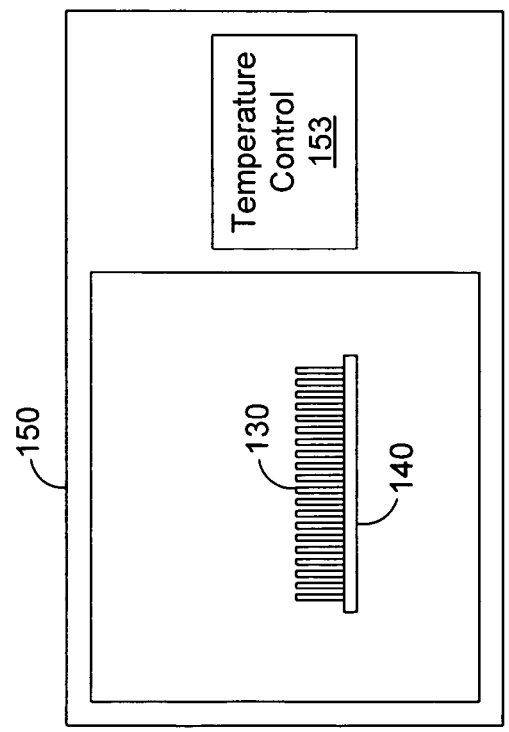

US 7,790,574 B2

BORON DIFFUSION IN SILICON DEVICES

CROSS REFERENCE TO RELATED CASES

This Patent Application claims priority to U.S. Provisional Patent Application No. 60/637,717 filed on Dec. 20, 2004, entitled "Development of Boron Diffusion Process for Silicon Devices", the entire text and drawing of which are expressly incorporated herein by reference.

GOVERNMENT LICENSE RIGHTS

The U.S. Government has a paid-up license in this invention and the right in limited circumstances to require the patent owner to license others on reasonable terms as provided for by the terms of DE-FC36-00GO10600 awarded by the Department of Energy.

BACKGROUND

It has been a long standing goal of researchers to find more desirable sources of energy. At the present time, the demand for energy is satisfied primarily by the consumption of fossil fuels and nuclear energy. The consumption of energy is accompanied by the creation of pollutants that are beginning to pose a serious threat to the environment. Forests are threatened by acid rain. The heat generated by the consumption of such energy sources has caused global warming, the long term effects of which are as yet unknown. For these and many more reasons, the search is on for efficient and inexpensive sources of energy without pollution.

One such source that meets this goal is the generation of electricity from sunlight. The primary device used for this process is the solar cell or photovoltaic device. Photovoltaic devices essentially create electrical current when exposed to sunlight. However, the photovoltaic technology is not without its problems as well. Chief of these is the high cost of manufacturing photovoltaic cells. Specifically, the high cost for manufacturing photovoltaic cells discourages their widespread use as other forms of energy are currently less expensive.

BRIEF DESCRIPTION OF THE SEVERAL VIEWS OF THE DRAWINGS

The invention can be understood with reference to the following drawings. The components in the drawings are not necessarily to scale. Also, in the drawings, like reference numerals designate corresponding parts throughout the several views.

FIG. 4A is a drawing illustrating a furnace employed to diffuse boron into a plurality of wafers that were coated with boric acid according to the process of FIG. 2 according to an embodiment of the present invention;

FIG. 4B is a drawing illustrating a box furnace employed to diffuse boron into a plurality of wafers that were coated with boric acid according to the process of FIG. 2 according to an embodiment of the present invention;

FIG. 4C is a drawing illustrating another furnace employed to diffuse boron into a plurality of wafers that were coated with boric acid according to the process of FIG. 2 according to an embodiment of the present invention;

DETAILED DESCRIPTION

According to the following discussion, a process for diffusing boron into silicon wafers employed in the creation of photovoltaic cells is described according to various embodiments of the present invention. As set forth below, the present invention provides for efficient means of diffusing boron into wafers by coating the wafers with a boric oxide solution and subjecting the wafers to a heating cycle with a fast heat ramp-up in order to release boron from the boric oxide solution for diffusion into the wafers as will be described.

Figure 1:
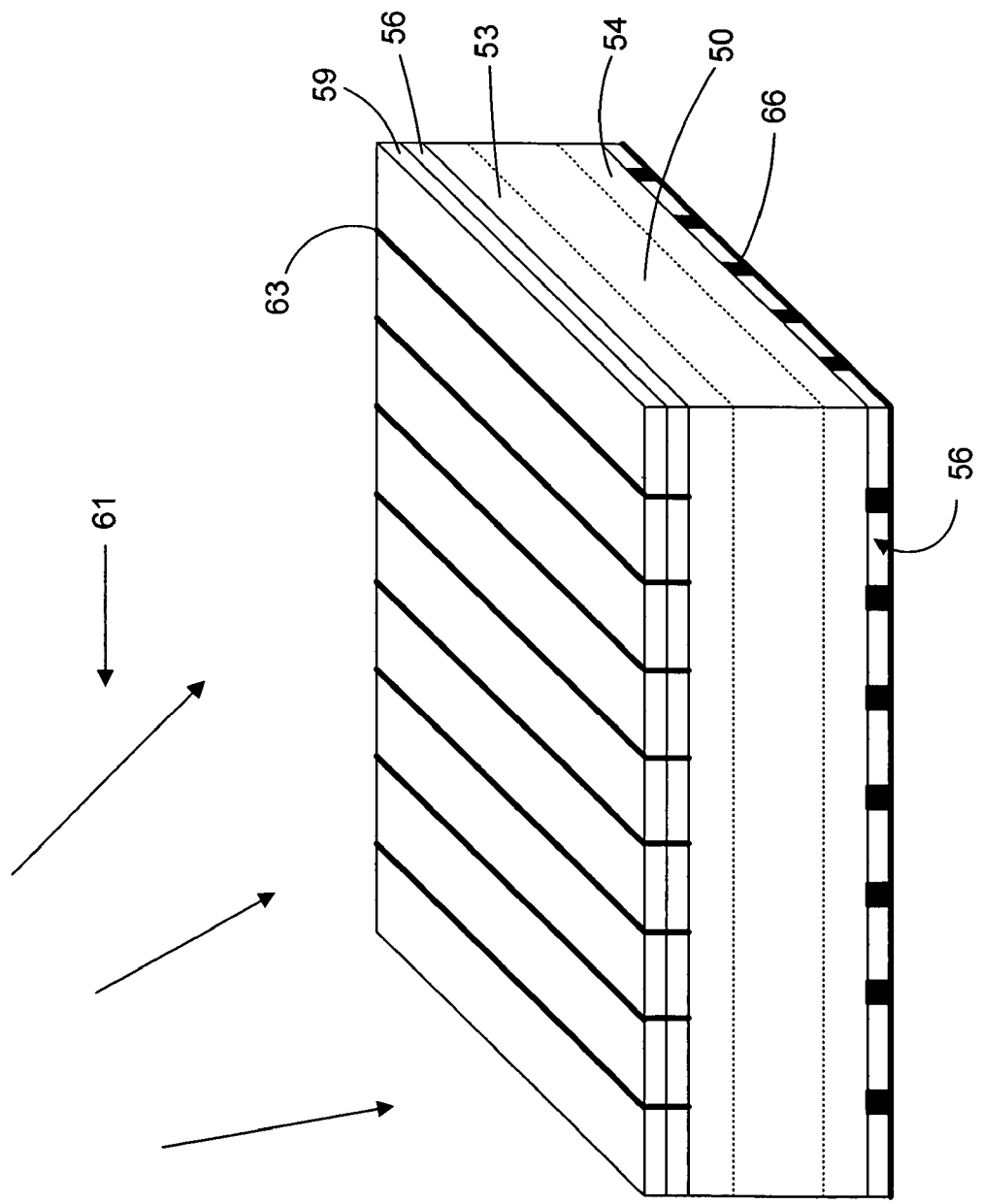
FIG. 1 is a drawing of one example of a photovoltaic cell that may be created using a diffusion process as described herein according to an embodiment of the present invention.

As shown in FIG. 1, shown is one example of a photovoltaic cell. The photovoltaic cell is made of a silicon wafer 50 that has been doped with a base dopant material. The surfaces of the wafer 50 are then diffused with dopant material forming two diffused regions 53 and 54. The diffused region 53 may form, for example, an emitter or p-n junction. The diffused region 54 may comprise, for example, a back surface field (BSF). In a sense, the wafer will have internal layers of diffused material and non-diffused material. The wafer may then be covered with a dielectric layers 56 on both sides that reduce surface recombination by passivating the surfaces. The final steps include the addition of an antireflection coating 59 to ensure the absorption of sunlight 61 and the introduction of contacts layers 63 and 66 which are connected to the diffused regions 53 which are used to connect the solar cell to an electrical load.

Figure 2:
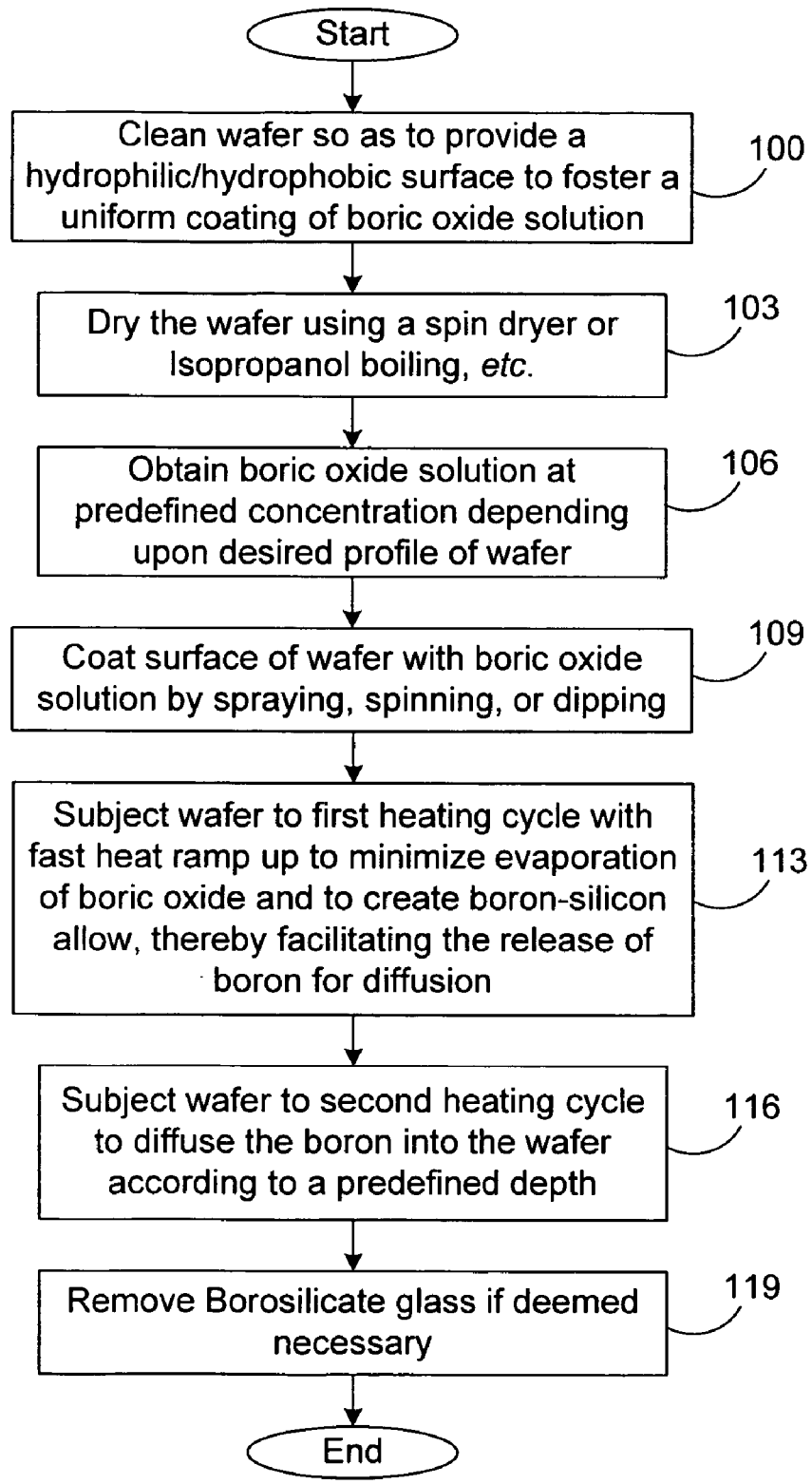
FIG. 2 is a flow chart that illustrates steps of a process of boron diffusion in a wafer.

With reference to FIG. 2, one of the dopants that may be employed to create the diffused regions 53 (FIG. 1) or 54 (FIG. 1) comprises boron. The diffusion of boron into silicon wafers is performed in a controlled process during the manufacturing of solar cells. In this respect, the depth of the diffusion of the boron, as well as, the concentration distribution of the boron diffused into a given silicon wafer is defined as the "dopant profile" of the wafer. The dopant profile of the wafer is specified so as to provide for a desired sheet resistance as can be appreciated by those with ordinary skill in the art. Since the concepts of a dopant profile and sheet resistance are well known by those skilled in the art, a detailed discussion of these concepts is omitted herein. The following discussion details a process by which boron is diffused into silicon wafers in order to achieve various desired dopant profiles as will be appreciated.

Beginning with box 100, the process starts with the cleaning or etching of the surfaces of one or more wafers so as to provide for either a hydrophilic or hydrophobic surface as desired that is substantially free of defects in/or contaminants to the extent possible. The surfaces are made hydrophilic so as to promote a uniform coating of boric oxide solution on the entire surface of the wafer when the boric oxide solution includes a solvent of water. The surfaces are made hydrophobic so as to promote a uniform coating of boric solution on the entire surface of the wafer when the boric oxide solution includes a solvent of ethanol or Isopropanol, etc.

In one embodiment, in order to clean or etch one or more surfaces of the wafer as desired, first a solution such as 1:1:2 $H_2O$:$H_2O_2$:$H_2SO_4$, for example, is applied to the surface of the wafer. This is applied in order to remove organic contaminants as can be appreciated. Thereafter, a solution of hydrofluoric acid (1:10 or other dilution HF:$H_2O$), for example, is applied to remove silicon dioxide components on the surface left by the prior treatment. Next, a solution such as hydrochloric acid (2:1:1 $H_2O$:$H_2O_2$:HCl), for example, is applied to remove metallic contaminants that may be disposed on the surface. In this respect, the application of the hydrofluoric acid and the hydrochloric acid may be repeatedly applied as desired or as deemed necessary. In this manner, the wafer is cleaned and a hydrophilic surface is left to promote the uniform distribution of boric acid along the surface itself. Alternatively, where it is desired that the surface of the wafer be hydrophobic, the cleaning with hydrofluoric acid and hydrochloric acid may be omitted.

It should be noted that cleaning solutions or methods other than those discussed above may also be employed in cleaning or etching the wafer surface(s) in preparation for the diffusion of boron as described herein as can be appreciated by those with ordinary skill in the art. For example, other solutions or methods may comprise, for example, Ammonium Hydroxide ($H_2O$:$H_2O_2$:$NH_4OH$) in place of the 1:1:2 $H_2O$:$H_2O_2$:$H_2SO_4$. Also Potassium Hydroxide (KOH) may be employed to remove metallic contaminants resulting from sawing operations to create the wafers from larger sheets of silicon, etc. Also, other cleaning techniques and solutions may be employed to create the hydrophilic or hydrophobic surfaces as desired.

Next, in box 103 the wafer is dried. This may be done, for example, using a spin dryer or by virtue of isopropyl alcohol (IPA) boiling as can be appreciated. In addition, other approaches may be employed to dry the wafer after the cleaning process of block 100 above.

Then, in box 106, an amount of boric oxide solution is obtained at a predefined concentration depending on the desired dopant profile of the boron diffusion desired in the wafer based upon a target sheet resistance. Specifically, if a profile of greater concentration is desired, then a greater concentration of boric oxide solution is obtained. Alternatively, if a lesser concentration of boron is desired in the profile, then a lesser concentration of boric oxide solution may be employed. Also, where it is desirable that a layer of borosilicate glass that forms during the process as will be described below is to be minimized, then the concentration of boric oxide solution may be a lesser concentration as one skilled in the art can appreciate.

The boric oxide solution may comprise, for example, boric acid which substantially comprises boric oxide dissolved in water or its equivalent. Alternatively, the boric oxide solution may comprise boric oxide dissolved in a solvent such as ethanol or Isopropanol, or other equivalent solvent. Since boric oxide tends to absorb water when in a pure solid state, it may be the case that solutions that are created with solvents such as ethanol or Isopropanol may include a component of water that existed in the boric oxide before the boric oxide was dissolved in the solvent.

In one example embodiment where the boric oxide solution comprises boric acid, the concentration of the boric acid may comprise, for example, anywhere from 0.2 to 1.0 wt % of boric oxide diluted in water. Nonetheless, it is understood that any concentration of boric acid may be employed with corresponding results achieved by virtue of the process described. In this respect, the actual concentration of boric acid or other types of boric oxide solutions as described above to be employed to manufacture photovoltaic cells with a specific target sheet resistance may be determined on an empirical basis.

Next, in box 109 the surface of the wafer is coated with the boric oxide solution. This may be done by spraying the boric oxide solution on the surface of the wafer, spinning the boric oxide solution onto the surface of the wafer, or dipping the wafer into the boric oxide solution. Thereafter, in box 113 the wafer is subjected to the first heating cycle. A fast heat ramp-up is associated with the first heating cycle. The fast heat ramp-up facilitates the evaporation of solvents such as water, ethanol, Isopropanol, or other solvents while at the same time minimizing the evaporation of the boric oxide. The boric oxide that remains reacts with silicon of the wafer, thereby resulting in the release of an amount of boron for diffusion into the wafer. In this respect, the reaction results in the creation of borosilicate glass and boron-silicon alloy that includes the boron that is free to diffuse into the wafer. Due to the fast heat ramp-up, the boron is essential trapped by the borosilicate glass before the substantial evaporation of boric oxide can occur.

The actual heating cycle may last, for example, anywhere from 30-60 seconds, or some other time period as may be deemed appropriate. The fast heat ramp-up associated with the first heating cycle ensures that solvent component of the boric oxide solution evaporates, but at the same time the evaporation of boric oxide is minimized or substantially prevented. In this respect, the fast heat ramp-up may generally comprise, for example, any ramp-up that is greater than 10° C. per second, although it is possible that slower ramp-up times may be employed in various circumstances. The maximum or operating temperature of the first heating cycle may generally be anywhere, for example, from 400° C. to 1000° C., although temperatures above and below this range may also be employed depending upon various circumstances.

Thus, given that boric oxide does not evaporate as quickly as solvents such as water, ethanol, or Isopropanol, the fast heat ramp-up allows the boric oxide that remains on the surface of the wafer to react with the silicon of the wafer, thereby forming silicon dioxide or glass as well as releasing the boron for diffusion. In this respect, the released boron effectively forms a boron-silicon alloy from which the boron is free to diffuse into the wafer. The reaction of boric oxide with silicon is described as follows:

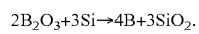

$$2B_2O_3 + 3Si \rightarrow 4B + 3SiO_2.$$

One product of this reaction that includes boron and silicon dioxide is called "borosilicate glass". Another product is the boron-silicon alloy. Generally the borosilicate glass is substantially formed on the outer surface with the boron-silicon alloy substantially underneath the borosilicate glass due to the partial diffusion of the released boron into the wafer. In some cases, the layer of borosilicate glass may be deemed a benefit, such as, for use as a passivation layer. In other circumstances, it may be desirable to remove the layer of borosilicate glass or minimize its creation in the first place. As described above, if the concentration of the boric oxide solution is low enough, then the creation of the borosilicate glass may be minimized or substantially prevented. In this manner, the thickness or mass of any borosilicate glass created during the process described herein may be controlled by adjusting the concentration of the boric oxide solution applied to the surface of the wafer.

Thus, by performing the fast heat ramp-up, ultimately, a thin layer of boron-silicon alloy is quickly created as described above. Due to the substantial formation of the borosilicate glass above the boron-silicon alloy, the free boron is trapped within the silicon before any substantial evaporation of the boric oxide takes place. Consequently, the boron is made available for diffusion into the wafer.

Thereafter, in box 116, the wafer is subjected to a second heating cycle to cause the diffusion of the released boron deep into the wafer according to a predefined depth. The predefined depth of diffusion is controlled, for example, based upon various factors such as the temperature and time duration of the heating cycle.

In one example, in one experiment wafers that had been coated with a boric oxide solution comprising 0.5% boric acid and were subjected to the first heating cycle where then subjected to a second heating cycle comprising a temperature of 925° C. for 60 minutes resulting in a sheet resistance of ~80Ω/□. In another experiment, similar wafers were heated at 1000° C. for 60 minutes resulting in a sheet resistance of ~25Ω/□.

Finally, in box 119, any amount of borosilicate glass that is formed on the wafer by virtue of the reaction between the boric oxide and the silicon of the wafer may be removed if deemed necessary. Note that it may not be necessary to perform this step if the borosilicate glass is employed as a passivation layer as was mentioned above.

Figure 3C:
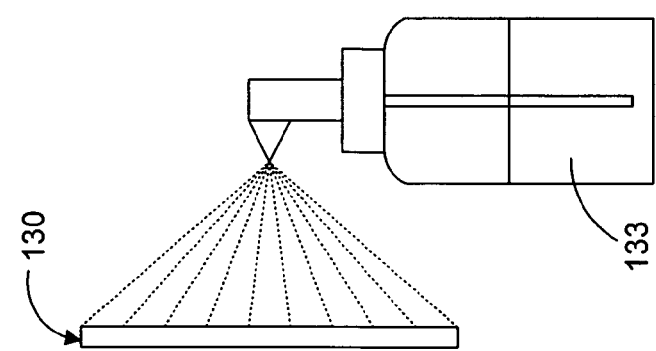
FIG. 3C is a drawing that illustrates a spraying of boric acid onto a wafer as part of the process depicted in FIG. 2 according to an embodiment of the present invention.
Figure 3B:
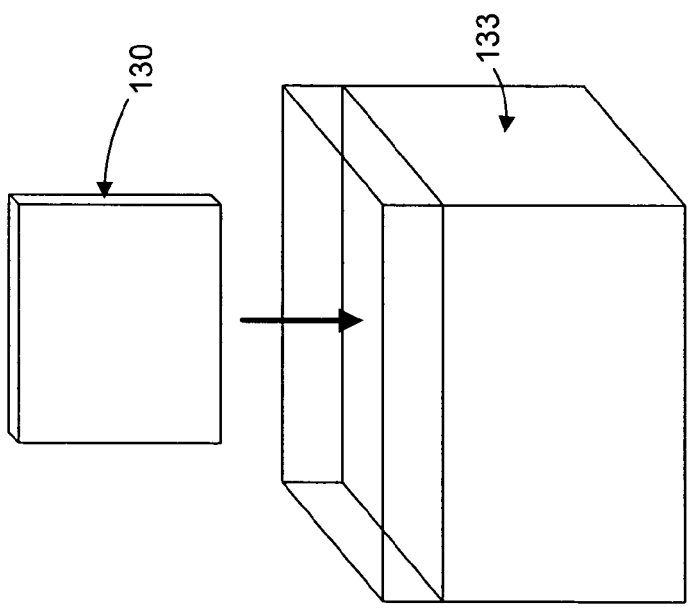
FIG. 3B is a drawing that illustrates the dipping of a wafer into boric acid in order to coat the wafer with boric acid as part of the process depicted in FIG. 2 according to an embodiment of the present invention.
Figure 3A:
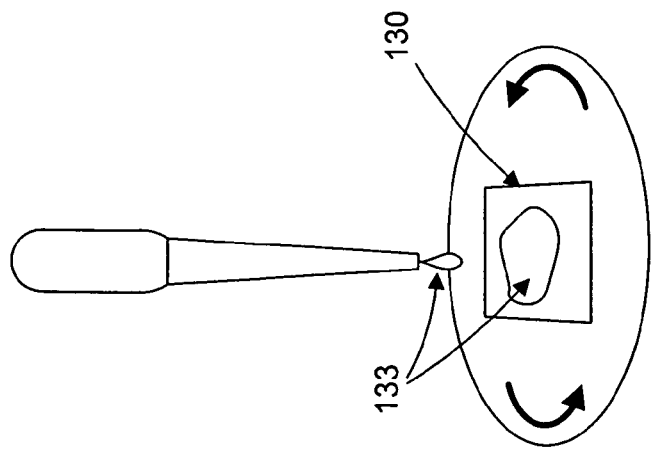
FIG. 3A is a drawing that illustrates the spinning of boric acid onto a wafer as part of the process depicted in FIG. 2 according to an embodiment of the present invention.

With reference next to FIGS. 3A, 3B, and 3C, shown are various methods by which the boric oxide solution may be applied to one or both of the surfaces of one or more silicon wafers. In particular, a silicon wafer 130 is shown in a spinning process in FIG. 3A, a dipping process in FIG. 3B, or a spraying process in FIG. 3C. In particular, with reference to FIG. 3A, an amount of boric oxide solution 133 may be applied to a surface of the wafer 130 and then the wafer is spun rapidly, thereby promoting the uniform distribution of the boric oxide solution on the surface of the wafer 130.

Alternatively, with reference to FIG. 3B, the whole wafer 130 may be dipped into a path of boric oxide solution 133. Alternatively, the wafer may be held in a position such that only one side of the wafer 130 comes into contact with the bath of boric oxide solution 133, thereby coating one side of the wafer 130.

Finally, as depicted in FIG. 3C, boric oxide solution 133 may be sprayed onto the surface of the wafer 130. The spraying of the wafer is shown with the use of a spray bottle. However, it is understood that the spraying mechanism might comprise one or more nozzles that are directed toward wafers placed on a belt of a belt furnace, for example, in an automated process as can be appreciated. The amount of spray that is applied to a given wafer 130 may be controlled so as to provide for a desired amount of boric oxide solution on the surface of the wafers 130 during the process as described. Thus, FIGS. 3A, 3B, and 3C, illustrate various means that may be employed to coat the wafers with the desired amount of boric oxide solution. Whether spinning, dipping, or spraying is employed, such methods may be employed in a mass production environment to reduce the cost of manufacturing photovoltaic cells as can be appreciated.

Referring next to FIG. 4A, shown is a furnace 137 that is employed to diffuse the boron into the wafers 130 according to a desired profile as was described above. In particular, the wafers 130 are placed in boats 140 that are positioned onto a walking beam or other conveyor structure that causes the boats 140 with the wafers 130 to progress slowly through the furnace 137. The furnace 137 includes a first chamber 146 and a second chamber 149. The first heating cycle is performed in the first chamber 146 in which the wafers 130 spend an amount of time $T_1$ to progress through the first chamber 146. The fact that the wafers 130 move from an unheated environment outside the first chamber 146 into the heated environment inside the chamber 146 provides for the fast heat ramp-up as described above.

After the wafers 130 leave the first chamber 146, they enter the second chamber 149 and are thus subjected to the second heating cycle to cause the diffusion of the boron that was released in the first heating cycle into the wafers 130. In this respect, the wafers 130 remain in the second chamber 149 for time $T_2$ at the temperature specified for the second chamber 149, depending upon the desired diffusion profile to be achieved. Thus, according to the embodiment of FIG. 4A, the first chamber is adjacent to the second chamber and provides for continued processing of wafers 130 in order to lessen the cost of production.

With reference to FIG. 4B, shown is another approach to processing of the wafers 130 according to an embodiment of the present invention. In this respect, shown is a box furnace 150 within which a boat 140 that contains a number of wafers 130 may be placed. The furnace 150 includes a temperature control 153 that is configured to provide for the fast heat ramp-up needed to release the boron from the boric oxide solution without the evaporation of the boric oxide as described above. The fast heat ramp-up is performed as part of the first heating cycle as described above.

Once the first heating cycle is complete and the boron is released for diffusion into the wafers 130, then the second heating cycle may be performed in a consecutive process in the same furnace 150. Thus, there may be a transition in the temperature between the first heating cycle and the second heating cycle, where the first heating cycle is designed for the release of the boron, and the second heating cycle is configured to provide for the diffusion of the free boron dopant into the wafer 130 to achieve the desired dopant profile.

Referring next to FIG. 4C, shown is another furnace 160 that may be employed in the process described above. The furnace 160 comprises a quartz tube 163 that is surrounded by a heating element 166. A boat 140 containing wafers 130 is placed in the tube as can be appreciated. The heating of the furnace 160 is controlled in much the same way as the box furnace 150 described above.

Figure 4D:
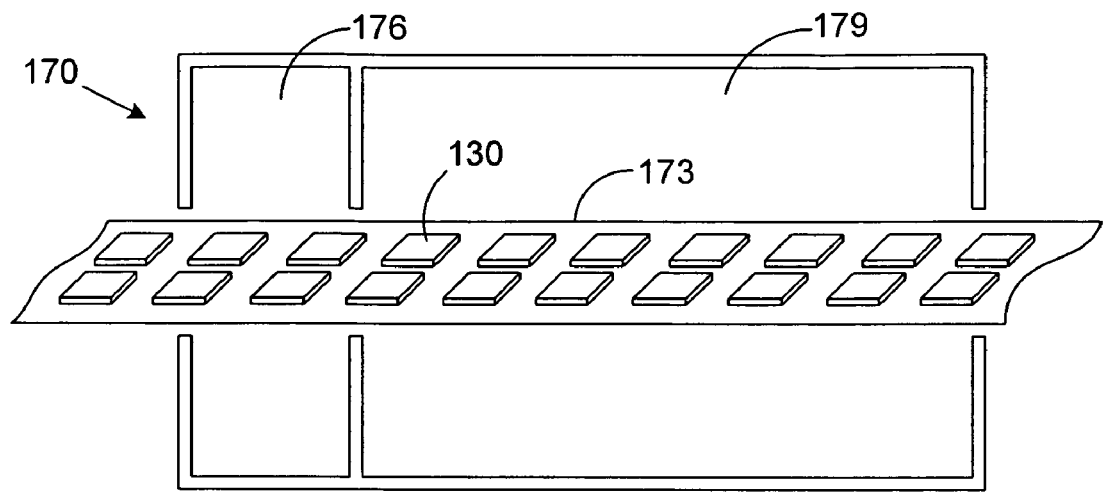
FIG. 4D is a drawing illustrating a belt furnace employed to diffuse boron into a plurality of wafers that were coated with boric acid according to the process of FIG. 2 according to an embodiment of the present invention.

With reference to FIG. 4D, shown is a belt furnace 170 that may be employed in the process described above. The belt furnace 170 includes a belt 173 upon which the wafers 130 are placed. While on the belt 173 in this manner, the exposed surfaces of the wafers may be subjected to a spray of boric oxide solution as mentioned above. In this respect, only a single side of the wafers is processed. The furnace 170 includes a first chamber 176 for the performance of a first heating cycle, and a second chamber 179 for the performance of a second heating cycle in a manner similar to the furnace 137 described above.

It is understood that the furnaces are described herein with respect to FIGS. 4A, 4B, 4C, and 4D are only shown as examples of furnaces that may be employed as described herein. It is further understood that other types of furnaces may be employed as well that may provide for significant throughput and ultimately reduce the cost of manufacturing the photovoltaic cells.

Figure 5:
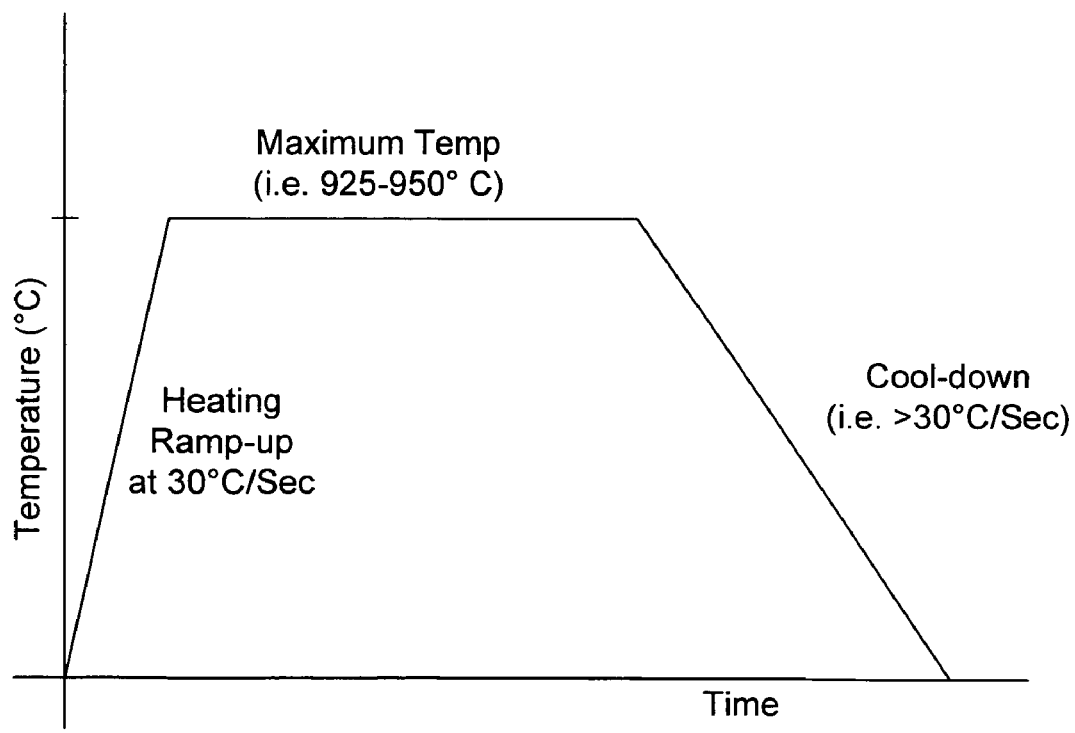
FIG. 5 is a graph illustrating a temperature curve of one example of a heating cycle employed in the process of FIG. 2 according to an embodiment of the present invention.

With reference to FIG. 5, shown is a graph of one example of the temperature over time of the first heating cycle according to an embodiment of the present invention. In this respect, the ramp-up as shown may comprise anywhere from 10° C. and upward. In one example experiment, a ramp-up of 30° C. per second was applied. Thereafter, the temperature reaches the maximum or operating temperature of the first heating cycle. In one example experiment, the maximum or operating temperature was held at anywhere from 925° C. to 950° C. for 60 seconds. Finally, a cool down is performed at the end of the first heating cycle. In the experiment performed, the cool down occurred at a rate of 30° C. per second, although any other cool down rate may be employed.

While the cool down bring the temperature of the wafers 130 back to room temperature, for example, before the wafers are placed in a second chamber or furnace for the diffusion process, it is understood that the second heating cycle may directly follow the first, and the cool down might comprise transition from the maximum or operating temperature of the first cycle to the maximum or operating temperature of the second cycle. Alternatively, it may be the case that, rather than cooling down, the heat will be increased from the maximum or operating temperature of the first heat cycle up to the maximum or operating temperature of the second heat cycle in order to provide for the desired diffusion as described above.

Figure 6:
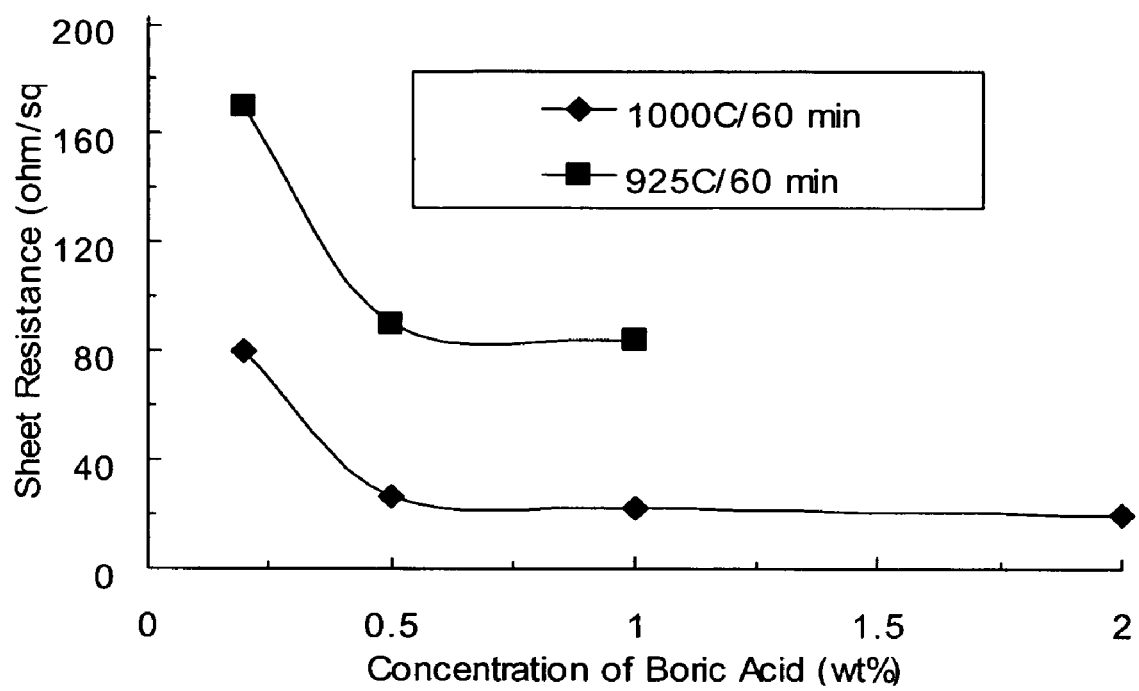
FIG. 6 is a graph illustrating a sheet resistance of a wafer resulting from various concentrations of, for example, boric acid used in the process of FIG. 2 according to an embodiment of the present invention.

Turning next to FIG. 6, shown is a graph that illustrates examples of the resulting sheet resistance of boron diffused emitters as a function of the concentration of boric oxide solution that comprises boric acid. One skilled in the art may determine the sheet resistances of obtained using other boric oxide solutions and at different diffusion temperatures and time durations.

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. A process for boron diffusion in a wafer, comprising the steps of:
    applying a boric oxide solution to a surface of the wafer;
    heating the wafer during a first heating cycle at a ramp-up rate greater than 10° C. per second to:
        form a borosilicate glass on the surface of the wafer;
        release an amount of boron underneath the borosilicate glass; and
    heating the wafer during a second heating cycle to;
        diffuse the released boron into the wafer;
    wherein the first heating cycle and the second heating cycle occur consecutively during a single heating process.

2. The process of claim 1, further comprising the step of cleaning the surface of the wafer so that the surface is hydrophilic.

3. The process of claim 1, further comprising the step of cleaning the surface of the wafer so that the surface is hydrophobic.

4. The process of claim 1, wherein the boric oxide solution further comprises boric acid.

5. The process of claim 1, wherein the boric oxide solution further comprises the boric oxide in a solvent taken from a group consisting of ethanol and Isopropanol (IPA).

6. The process of claim 3, wherein the boric oxide solution further comprises a solvent that promotes the uniform coating of the boric oxide solution on the hydrophobic surface.

7. The process of claim 1, wherein heating the wafer during the first heating cycle further comprises the steps of:
    evaporating a solvent component of the boric oxide solution;
    minimizing evaporation of the boric oxide; and
    facilitating a reaction between the boric oxide and the silicon to release the amount of boron underneath the borosilicate glass.

8. The process of claim 7, wherein the reaction between the boric oxide and the silicon forms a boron-silicon alloy due to a partial diffusion of the boron into the wafer.

9. The process of claim 8, wherein the borosilicate glass is removed from the surface of the wafer.

10. The process of claim 1, further comprising controlling a thickness of the borosilicate glass by adjusting a concentration of an amount of boric oxide in the boric oxide solution applied to the surface of the wafer.

11. The process of claim 1, wherein the wafer is heated during the first heating cycle at a rate of about 30° C. per second.

12. The process of claim 1, wherein the first heating cycle comprises an operating temperature that falls within a range of 400° C. to 1000° C.

13. The process of claim 1, wherein the boric oxide solution is applied to the surface of the wafer by spraying the boric oxide solution onto the surface of the wafer.

14. The process of claim 1, wherein the boric oxide solution is applied to the surface of the wafer by dipping the wafer into the boric oxide solution.

15. The process of claim 1, wherein the boric oxide solution is applied to the surface of the wafer by spinning the boric oxide solution onto the wafer.

16. A process for boron diffusion in a silicon wafer, comprising the steps of:
    applying a boric oxide solution to a surface of the wafer;
    heating the wafer during a first heating cycle at a ramp-up rate greater than 10° C. per second to:
        form a borosilicate glass on an outer surface of the wafer;
        release boron from the boric oxide into the silicon; and
        form a boron-silicon alloy underneath the borosilicate glass;
    heating the wafer during a second heating cycle to diffuse boron from the boron-silicon alloy into the wafer; and
    wherein the first heating cycle and the second heating cycle occur consecutively during a single heating process.

* * * * *